(12) United States Patent
Fujiki et al.

(10) Patent No.: US 7,439,842 B2
(45) Date of Patent: Oct. 21, 2008

(54) LAMINATED BALUN TRANSFORMER

(75) Inventors: Yasuhiro Fujiki, Phoenix, AZ (US);
Katsuji Matsuta, Yokohama (JP);
Kosuke Ishida, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/939,723

(22) Filed: Nov. 14, 2007

(65) Prior Publication Data

US 2008/0062727 A1    Mar. 13, 2008

Related U.S. Application Data

(63) Continuation of application No. PCT/JP2006/307336, filed on Apr. 6, 2006.

(30) Foreign Application Priority Data

May 20, 2005    (JP)    ............... 2005-148437

(51) Int. Cl.
*H01F 5/00*    (2006.01)
(52) U.S. Cl. .................. 336/200; 336/223; 336/232
(58) Field of Classification Search .............. 336/200, 336/223, 232
See application file for complete search history.

(56) References Cited

U.S. PATENT DOCUMENTS

| 4,819,784 | A  | * | 4/1989 | Sticht .................... 198/395 |
| 6,285,273 | B1 | * | 9/2001 | Morikawa ................ 336/200 |
| 6,388,551 | B2 | * | 5/2002 | Morikawa ................ 336/223 |
| 6,448,879 | B1 | * | 9/2002 | Kitamura ................. 336/200 |
| 6,628,189 | B2 | * | 9/2003 | Yazaki et al. ............. 336/200 |
| 6,717,502 | B2 |   | 4/2004 | Yue |
| 6,779,261 | B2 |   | 8/2004 | Yue |
| 6,903,643 | B2 | * | 6/2005 | Lee et al. ................. 336/200 |
| 6,998,951 | B2 |   | 2/2006 | Itou et al. |
| 2001/0040495 | A1 | * | 11/2001 | Morikawa ............... 336/223 |
| 2005/0030144 | A1 | * | 2/2005 | Yoshida et al. ........... 336/200 |

FOREIGN PATENT DOCUMENTS

JP    04-206905 A    7/1992

(Continued)

OTHER PUBLICATIONS

Official communication issued in the International Application No. PCT/JP2006/307336, mailed on Jun. 20, 2006.

*Primary Examiner*—Anh T Mai
(74) *Attorney, Agent, or Firm*—Keating & Bennett, LLP

(57) ABSTRACT

A laminated balun transformer that achieves improved balance characteristics and prevents the occurrence of parasitic inductance has an impedance transformation ratio of one to four and outputs balanced signals generated from an unbalanced signal. The laminated balun transformer includes a magnetic substrate, a laminated body, and external electrodes. The laminated body includes a first transformer, a second transformer, and a non-magnetic body which completely covers the first and second transformers from the outside. The first and second transformers are arranged side by side in a direction substantially parallel to the magnetic substrate. A primary coil of the first transformer and a secondary coil of the second transformer are configured to be 180-degree rotationally symmetric with respect to a center line, while a secondary coil and a primary coil are also configured to be 180-degree rotationally symmetric with respect to the center line L.

2 Claims, 11 Drawing Sheets

FOREIGN PATENT DOCUMENTS

| | | |
|---|---|---|
| JP | 06-120428 A | 4/1994 |
| JP | 08-203737 A | 8/1996 |
| JP | 09-139315 A | 5/1997 |
| JP | 11-054336 A | 2/1999 |
| JP | 2002-359507 A | 12/2002 |

* cited by examiner

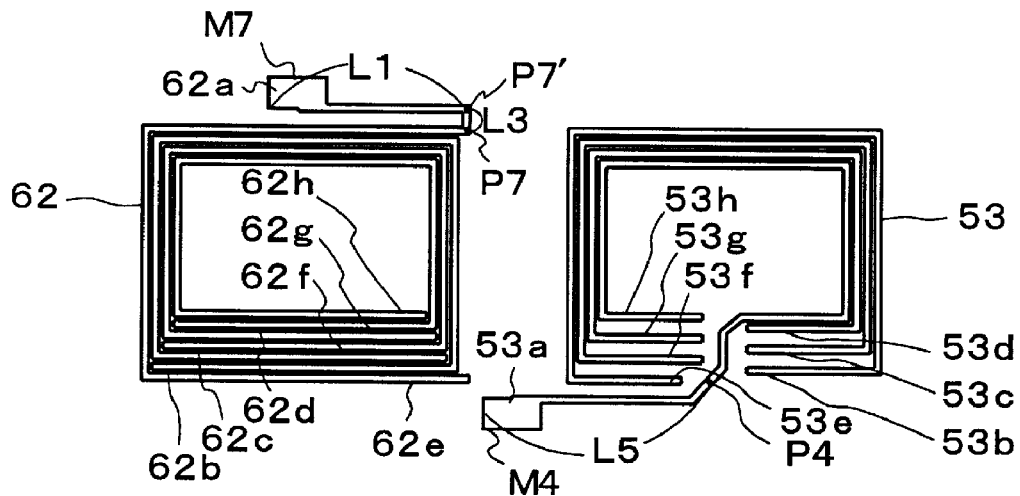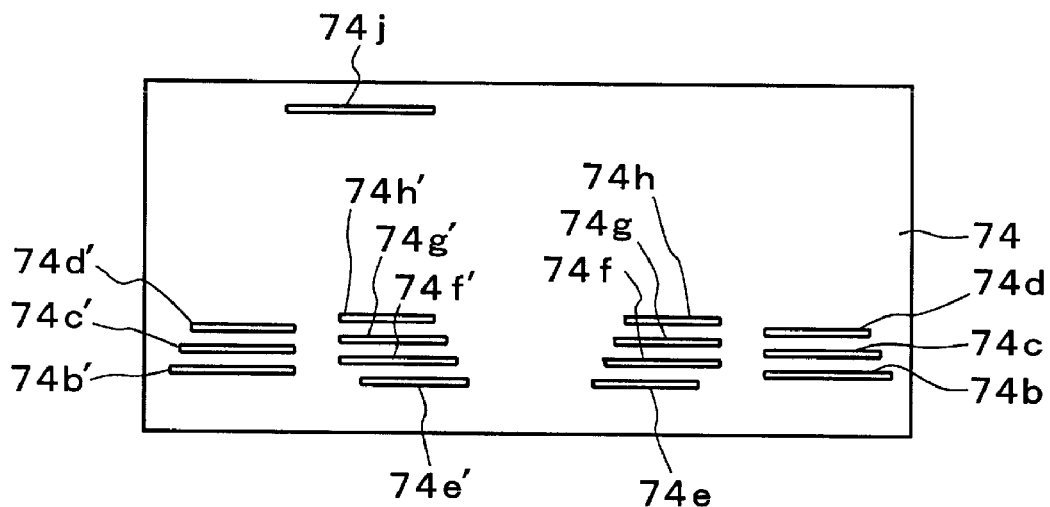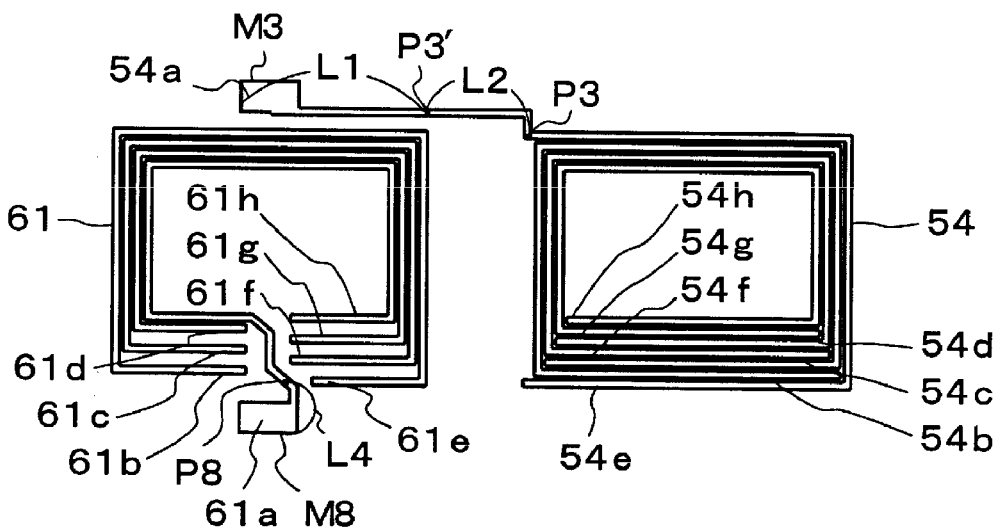

LAMINATED BALUN TRANSFORMER

BACKGROUND OF THE INVENTION

1. Field of the Invention

The present invention relates to a laminated balun transformer used as a balanced-to-unbalanced transformer for an integrated circuit (IC) in a mobile phone, for an antenna for a television receiver, or the like, and particularly relates to a laminated balun transformer having, for example, an impedance transformation ratio of one to four.

2. Description of the Related Art

As illustrated in an equivalent circuit diagram of FIG. 19, a one-to-four type balun transformer includes a first transformer 100 and a second transformer 200. By connecting coils 101 and 102 included in the first transformer 100 to coils 201 and 202 included in the second transformer 200 as illustrated in FIG. 19, the ratio of impedance on the side of an unbalanced terminal 300 to impedance on the side of balanced terminals 301 and 302 is made to be one to four.

Examples of conventional laminated balun transformers having a circuit configuration of this type are disclosed in Japanese Unexamined Patent Application Publication No. 04-206905 and Japanese Unexamined Patent Application Publication No. 06-120428.

These laminated balun transformers are characterized in that they are constructed by stacking magnetic sheets, non-magnetic sheets, and conductive patterns for forming coils of the first and second transformers 100 and 200, and thus are compact in size.

When the conventional laminated balun transformer described above is used for an IC in a mobile phone or the like, high-frequency signals are processed therein. This causes parasitic inductance to occur at many points in inter-transformer connection lines which connect the transformers 100 and 200. This parasitic inductance will be a major factor that will degrade balance characteristics (i.e., amplitude balance and phase balance) between differential signals input to and output from the balanced terminals 301 and 302. However, in the conventional laminated balun transformer described above, since no effective mechanism is provided to deal with such parasitic inductance, degradation of balance characteristics cannot be avoided.

SUMMARY OF THE INVENTION

In order to overcome the problems described above, preferred embodiments of the present invention provide a laminated balun transformer that can achieve improved balance characteristics and prevent the occurrence of parasitic inductance.

A laminated balun transformer according to a preferred embodiment of the present invention includes a first magnetic substrate, a laminated body laminated on the first magnetic substrate and including a first transformer and a second transformer, and a second magnetic substrate disposed on the laminated body. The first transformer and the second transformer each include a primary coil and a secondary coil facing each other. The first transformer and the second transformer are arranged side by side in an insulator included in the laminated body such that the first transformer and the second transformer are arranged in a direction substantially parallel to the first magnetic substrate. An end portion of a first line formed by extending one end of the primary coil in the first transformer is used as an unbalanced terminal, an end portion of a second line formed by extending the other end of the primary coil in the first transformer is used as a balanced terminal, end portions of a third line and a fourth line formed by extending opposite ends of the secondary coil in the first transformer are used as ground terminals, a fifth line formed by extending one end of the primary coil in the second transformer is connected to the first line of the first transformer, a sixth line formed by extending the other end of the primary coil in the second transformer is connected to the fourth line of the first transformer, a seventh line formed by extending one end of the secondary coil in the second transformer is connected to the third line of the first transformer, and an end portion of an eighth line formed by extending the other end of the secondary coil in the second transformer is used as a balanced terminal. Thus, the ratio of impedance at a side of the unbalanced terminal to impedance at a side of the balanced terminals is set to one to four; the secondary coil of the second transformer is configured to be 180-degree rotationally symmetric relative to the primary coil of the first transformer with respect to a center line lying in a horizontal plane between the primary coils and the secondary coils of the first and second transformers and located in a gap between the first and second transformers, and the primary coil of the second transformer is configured to be 180-degree rotationally symmetric relative to the secondary coil of the first transformer with respect to the center line; and thus, inductance values of the first line of the first transformer and the seventh line of the second transformer, the second line of the first transformer and the eighth line of the second transformer, the third line of the first transformer and the fifth line of the second transformer, and the fourth line of the first transformer and the sixth line of the second transformer that are equally distributed on both sides of the center line are made equal to each other, that is, the inductance values of the first line, second line, third line, and fourth line are made equal to the inductance values of the seventh line, eighth line, fifth line, and sixth line, respectively.

With this configuration, since the ratio of impedance at the unbalanced terminal side to that at the balanced terminal side is set to one to four in the first and second transformers, balanced signals generated from an unbalanced signal input to the unbalanced terminal side can be efficiently output from the balanced terminal side. Moreover, the secondary coil of the second transformer is configured to be 180-degree rotationally symmetric relative to the primary coil of the first transformer with respect to the center line; the primary coil of the second transformer is configured to be 180-degree rotationally symmetric relative to the secondary coil of the first transformer with respect to the center line; and inductance values of the first line of the first transformer and the seventh line of the second transformer, the second line of the first transformer and the eighth line of the second transformer, the third line of the first transformer and the fifth line of the second transformer, and the fourth line of the first transformer and the sixth line of the second transformer that are equally distributed on both sides of the center line are made equal to each other, that is, the inductance values of the first line, second line, third line, and fourth line are made equal to the inductance values of the seventh line, eighth line, fifth line, and sixth line, respectively. Therefore, inductance values on both sides of the center line can be balanced. This makes it possible not only to improve balance characteristics (i.e., amplitude balance and phase balance) of balanced signals output from a pair of balanced terminals, but also to prevent the occurrence of parasitic inductance that often occurs when high-frequency signals are processed.

The laminated balun transformer described above preferably includes a first external electrode, a second external electrode, and a third external electrode provided on one outer side of the laminated body so as to be equally spaced in sequence in a direction in which the first and second transformers are arranged; and a fourth external electrode, a fifth external electrode, and a sixth external electrode provided on another outer side of the laminated body, the another outer side being opposite the one outer side, such that the fourth, fifth, and sixth external electrodes face the first, second, and third external electrodes, respectively. The unbalanced terminal defined by the end portion of the first line is connected to the first external electrode; the balanced terminal defined by the end portion of the second line is connected to the fourth external electrode; the ground terminal defined by the end portion of the third line and the ground terminal being the end portion of the fourth line are connected to the third external electrode and fifth external electrode for grounding, respectively; the balanced terminal defined by the end portion of the eighth line is connected to the sixth external electrode; and one or both portions is or are connected to the second external electrode, with one portion being an intermediate portion of the third line extending toward the third external electrode and located near the second external electrode for grounding and the other portion being an intermediate portion of the seventh line and located near the second external electrode.

With this configuration, the end portions of the respective lines are connected to the first and third to sixth external electrodes, and moreover, one or both of intermediate portions of the third and seventh lines is or are connected to the second external electrode for grounding. Therefore, all the first to sixth external electrodes are connected to a circuit in the laminated body and brought into conduction. As a result, it is possible to prevent the occurrence of parasitic capacitance and parasitic inductance caused by the presence of an external electrode that is not connected to the circuit in the laminated body.

As described above, preferred embodiments of the present invention make it possible to provide a laminated balun transformer that can achieve improved balance characteristics of balanced signals output from balanced terminals and can prevent the occurrence of parasitic inductance.

In particular, according to a preferred embodiment of the present invention, all external electrodes are connected to the circuit in the laminated body and thus, the occurrence of parasitic capacitance and parasitic inductance can be prevented. Therefore, it is possible to significantly reduce balun loss of the entire laminated balun transformer.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 7 is a plan view of conductive patterns on the third layer from the lowermost layer.

FIG. 8 is a plan view of a non-magnetic layer.

FIG. 9 is a plan view of conductive patterns on the uppermost layer.

DETAILED DESCRIPTION OF PREFERRED EMBODIMENTS

Preferred embodiments of the present invention will now be described with reference to the drawings.

First Preferred Embodiment

Figure 1:
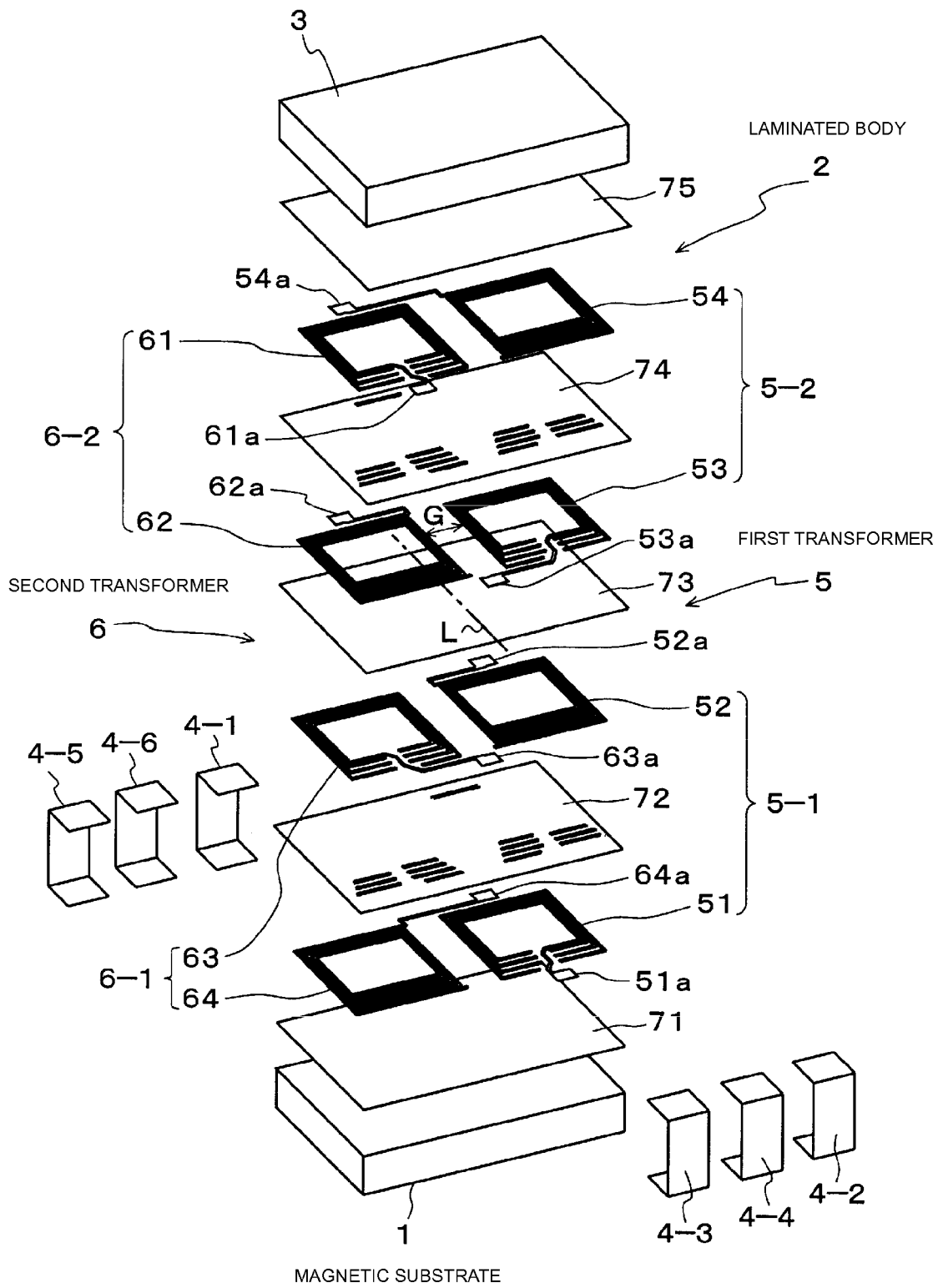
FIG. 1 is an exploded perspective view of a laminated balun transformer according to a first preferred embodiment of the present invention.
Figure 2:
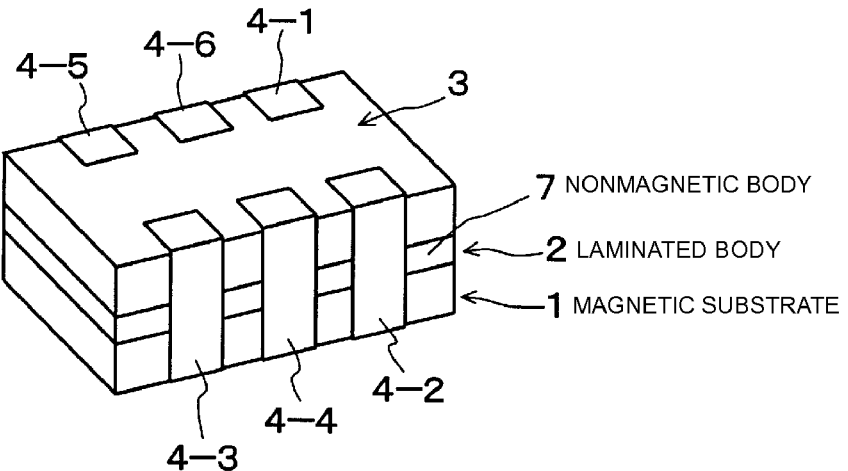
FIG. 2 is an external view of the laminated balun transformer.

FIG. 1 is an exploded perspective view of a laminated balun transformer according to a first preferred embodiment of the present invention. FIG. 2 is an external view of the laminated balun transformer.

As illustrated in FIG. 2, the laminated balun transformer of the present preferred embodiment includes a magnetic substrate 1 serving as a first magnetic substrate, a laminated body 2 disposed on the magnetic substrate 1, a magnetic substrate 3 bonded to the top surface of the laminated body 2 and serving as a second magnetic substrate, and external electrodes 4-1 to 4-6.

As illustrated in FIG. 1, the laminated body 2 includes a first transformer 5 and a second transformer 6 which are substantially identical in structure and are oriented in the same direction, and a non-magnetic body 7 (see FIG. 2) serving as an insulator which completely covers the first and second transformers 5 and 6 from the outside.

The non-magnetic body 7 is, for example, a dielectric formed by stacking non-magnetic layers 71 to 75. The first and second transformers 5 and 6 are formed as patterns on the non-magnetic layers 71 to 74.

More specifically, the first transformer 5 includes a primary coil 5-1 and a secondary coil 5-2 that face each other in the stacking direction. The primary coil 5-1 includes a conductive pattern 51 and a conductive pattern 52, while the secondary coil 5-2 includes a conductive pattern 53 and a conductive pattern 54.

Similarly, the second transformer 6 includes a primary coil 6-1 and a secondary coil 6-2 that face each other in the stacking direction. Then, the primary coil 6-1 includes a conductive pattern 63 and a conductive pattern 64, while the secondary coil 6-2 includes a conductive pattern 61 and a conductive pattern 62.

A configuration of the first and second transformers 5 and 6 will now be described in detail.

The conductive patterns 51 and 64 are formed by photolithography or the like on the non-magnetic layer 71 laminated on the magnetic substrate 1. After the non-magnetic layer 72 is laminated on the conductive patterns 51 and 64, the conductive patterns 52 and 63 are formed on the non-magnetic layer 72.

Figure 3:
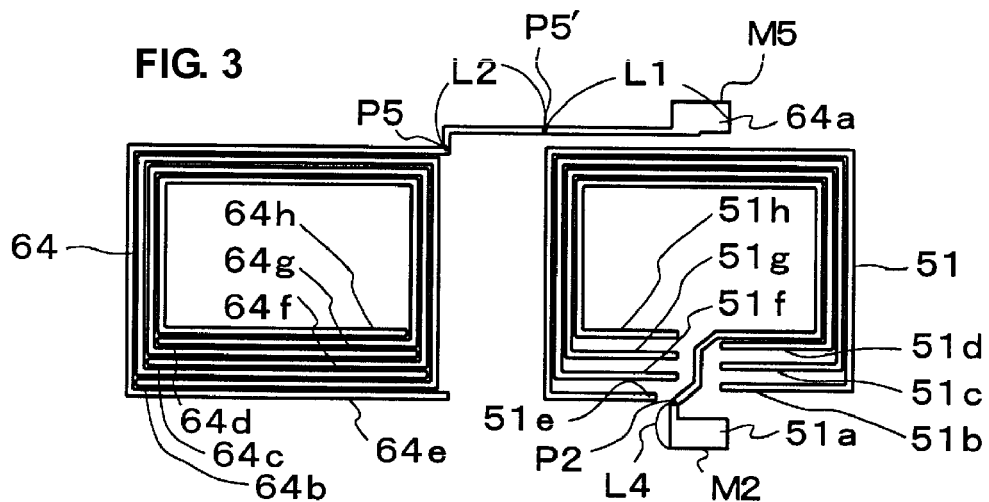
FIG. 3 is a plan view of conductive patterns on the lowermost layer.
Figure 4:
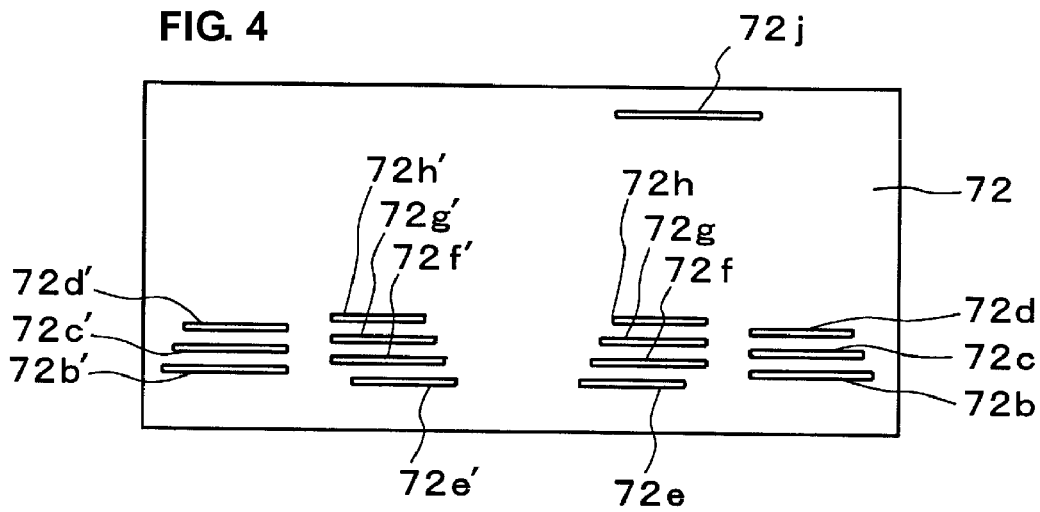
FIG. 4 is a plan view of a non-magnetic layer.
Figure 5:
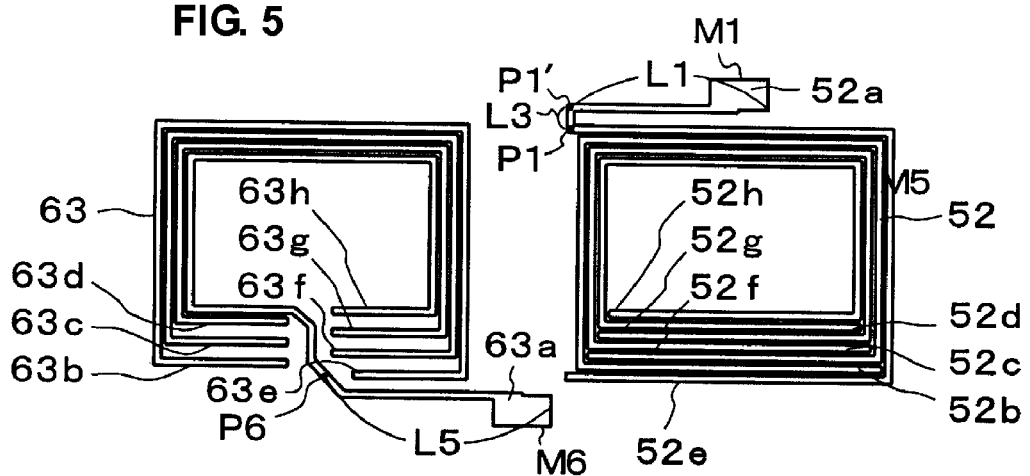
FIG. 5 is a plan view of conductive patterns on the second layer from the lowermost layer.
Figure 6:
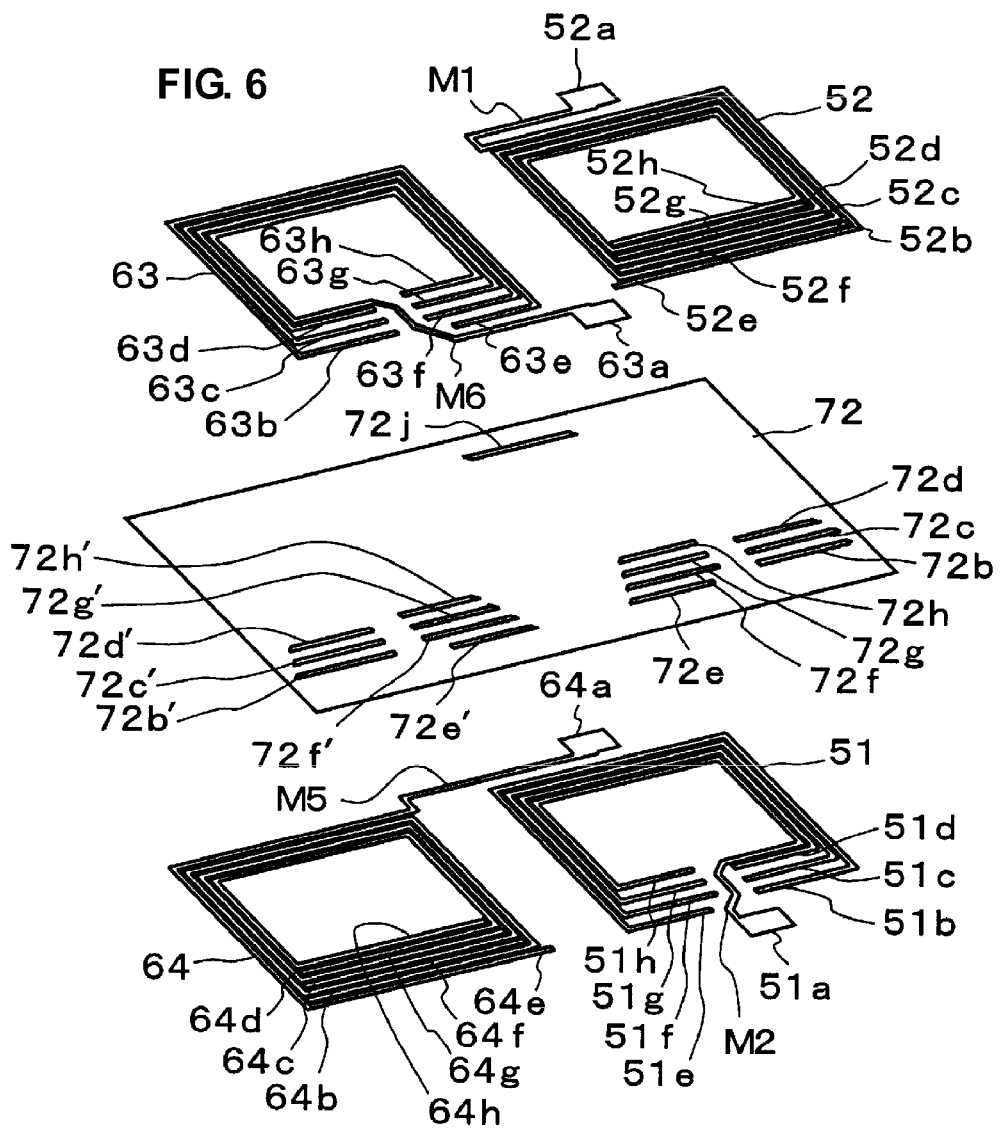
FIG. 6 is an exploded perspective view illustrating a connection of the conductive patterns on the lowermost layer and the conductive patterns on the second layer.

FIG. 3 is a plan view of the conductive patterns 51 and 64. FIG. 4 is a plan view of the non-magnetic layer 72. FIG. 5 is a plan view of the conductive patterns 52 and 63. FIG. 6 is an exploded perspective view illustrating a connection of the conductive patterns 51 and 64 and the conductive patterns 52 and 63.

As illustrated in FIG. 3, the conductive pattern 51 has an internal electrode 51a drawn from inside the conductive pattern 51. End portions 51b to 51d of the conductive pattern 51 are arranged to the right of the internal electrode 51a, while end portions 51e to 51h of the conductive pattern 51 are arranged to the left of the internal electrode 51a. As illustrated in FIG. 5, the conductive pattern 52 has an internal electrode 52a drawn to the outside. End portions 52b to 52d oriented in the rightward direction and end portions 52e to 52h oriented in the leftward direction are alternately arranged on the side opposite the internal electrode 52a.

As illustrated in FIG. 6, the end portions 51b to 51d of the conductive pattern 51 and the end portions 52b to 52d of the conductive pattern 52 are connected to each other via through holes 72b to 72d in the non-magnetic layer 72, while the end portions 51e to 51h of the conductive pattern 51 and the end portions 52e to 52h of the conductive pattern 52 are connected to each other via through holes 72e to 72h. This makes it possible to form the spiral primary coil 5-1 having the internal electrodes 51a and 52a at its opposite ends.

That is, the primary coil 5-1 has a long first line M1 (see FIG. 5) formed by extending an end of the conductive pattern 52 from a starting point P1, the end being one end of the primary coil 5-1, and also has a short second line M2 (see FIG. 3) formed by extending an end of the conductive pattern 51 from a starting point P2, the end being the other end of the primary coil 5-1. Then, as will be described below, the internal electrodes 52a and 51a, which are end portions of the first and second lines M1 and M2, are used as an unbalanced terminal and a balanced terminal, respectively.

On the other hand, the conductive pattern 64 has an internal electrode 64a drawn to the center and outside of the adjacent conductive pattern 51 (i.e., drawn to a position corresponding to the internal electrode 52a). End portions 64b to 64d oriented in the leftward direction and end portions 64e to 64h oriented in the rightward direction are alternately arranged on the side opposite the side to which the internal electrode 64a is drawn. As illustrated in FIG. 5, the conductive pattern 63 has an internal electrode 63a drawn from inside the conductive pattern 63 to the center between the conductive patterns 52 and 63. End portions 63b to 63d of the conductive pattern 63 are arranged to the left of a lead wire of the internal electrode 63a, while end portions 63e to 63h are arranged to the right of this lead wire. Then, as illustrated in FIG. 6, the end portions 64b to 64d of the conductive pattern 64 and the end portions 63b to 63d of the conductive pattern 63 are connected to each other via through holes 72b' to 72d' in the non-magnetic layer 72, while the end portions 64e to 64h of the conductive pattern 64 and the end portions 63e to 63h of the conductive pattern 63 are connected to each other via through holes 72e' to 72h'. This makes it possible to form the spiral primary coil 6-1 having the internal electrodes 64a and 63a at its opposite ends.

That is, the primary coil 6-1 has a long fifth line M5 (see FIG. 3) formed by extending an end of the conductive pattern 64 from a starting point P5, the end being one end of the primary coil 6-1, and also has a long sixth line M6 (see FIG. 5) formed by extending an end of the conductive pattern 63 from a starting point P6, the end being the other end of the primary coil 6-1. Then, the fifth line M5 and the first line M1 are connected to each other via a through hole 72j in the non-magnetic layer 72, while the internal electrode 63a of the sixth line M6 is connected through an external electrode 4-4 to an internal electrode 53a of a fourth line M4 described below.

As illustrated in FIG. 1, the conductive patterns 53 and 62 are formed on the non-magnetic layer 73 laminated on the conductive patterns 52 and 63. After the non-magnetic layer 74 is laminated on the conductive patterns 53 and 62, the conductive patterns 54 and 61 are formed on the non-magnetic layer 74.

Figure 10:
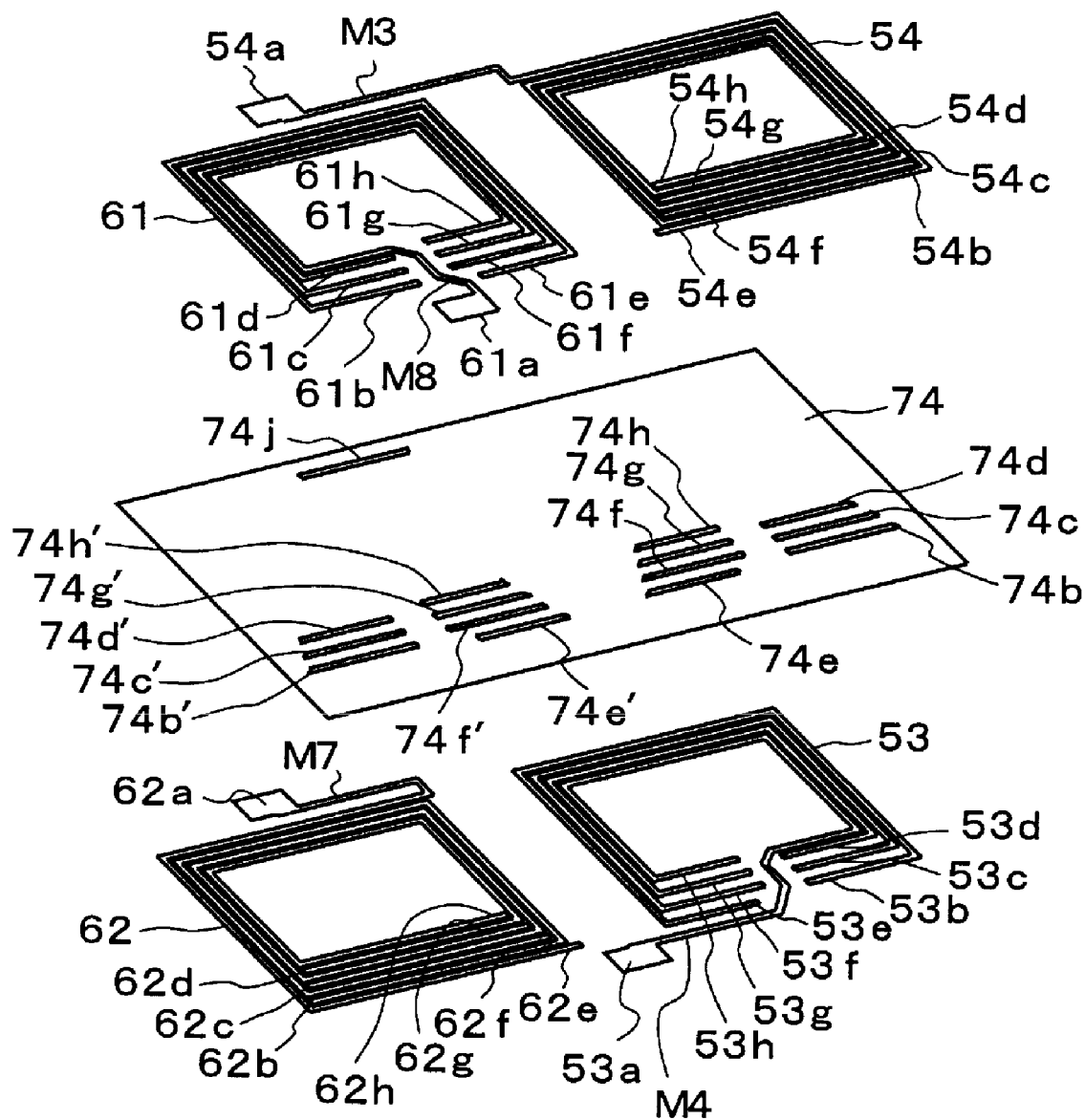
FIG. 10 is an exploded perspective view illustrating a connection of the conductive patterns on the third layer and the conductive patterns on the uppermost layer.

FIG. 7 is a plan view of the conductive patterns 53 and 62. FIG. 8 is a plan view of the non-magnetic layer 74. FIG. 9 is a plan view of the conductive patterns 54 and 61. FIG. 10 is an exploded perspective view illustrating a connection of the conductive patterns 53 and 62 and the conductive patterns 54 and 61.

As illustrated in FIG. 7, the conductive pattern 53 has the internal electrode 53a drawn from inside the conductive pattern 53 to the center between the conductive patterns 53 and 62. End portions 53b to 53d of the conductive pattern 53 are arranged to the right of a lead wire of the internal electrode 53a, while end portions 53e to 53h are arranged to the left of this lead wire. As illustrated in FIG. 9, the conductive pattern 54 has an internal electrode 54a drawn to the center and outside of the adjacent conductive pattern 61 (i.e., drawn to a position corresponding to an internal electrode 62a). End portions 54b to 54d oriented in the rightward direction and end portions 54e to 54h oriented in the leftward direction are alternately arranged on the side opposite the side to which the internal electrode 54a is drawn.

Then, as illustrated in FIG. 10, the end portions 53b to 53d of the conductive pattern 53 and the end portions 54b to 54d of the conductive pattern 54 are connected to each other via through holes 74b to 74d in the non-magnetic layer 74, while the end portions 53e to 53h of the conductive pattern 53 and the end portions 54e to 54h of the conductive pattern 54 are connected to each other via through holes 74e to 74h. This makes it possible to form the spiral secondary coil 5-2 having the internal electrodes 53a and 54a at its opposite ends.

That is, the secondary coil 5-2 has a long third line M3 (see FIG. 9) formed by extending an end of the conductive pattern 54 from a starting point P3, the end being one end of the secondary coil 5-2, and also has the long fourth line M4 (see FIG. 7) formed by extending an end of the conductive pattern 53 from a starting point P4, the end being the other end of the secondary coil 5-2. Then, as will be described below, the internal electrodes 54a and 53a, which are end portions of the third and fourth lines M3 and M4, respectively, are used as ground terminals.

On the other hand, the conductive pattern 62 has the internal electrode 62a drawn outward. End portions 62b to 62d oriented in the leftward direction and end portions 62e to 62h oriented in the rightward direction are alternately arranged on the side opposite the internal electrode 62a. As illustrated in FIG. 9, the conductive pattern 61 has an internal electrode 61a drawn from inside the conductive pattern 61. End portions 61b to 61d of the conductive pattern 61 are arranged to the left of a lead wire of the internal electrode 61a, while end portions 61e to 61h are arranged to the right of this lead wire. Then, as illustrated in FIG. 10, the end portions 62b to 62d of the conductive pattern 62 and the end portions 61b to 61d of the conductive pattern 61 are connected to each other via through holes 74b' to 74d' in the non-magnetic layer 74, while the end portions 62e to 62h of the conductive pattern 62 and the end portions 61e to 61h of the conductive pattern 61 are connected to each other via through holes 74e' to 74h'. This makes it possible to form the spiral secondary coil 6-2 having the internal electrodes 62a and 61a at its opposite ends.

Lead wires of the internal electrodes 54a and 62a are connected to each other via a through hole 74j in the non-magnetic layer 72.

Then, as illustrated in FIG. 1, the non-magnetic layer 75 is laminated on the conductive patterns 54 and 61, and the magnetic substrate 3 is bonded to the top surface of the non-magnetic layer 75.

That is, the secondary coil 6-2 has a long seventh line M7 (see FIG. 7) formed by extending an end of the conductive pattern 62 from a starting point P7, the end being one end of the secondary coil 6-2, and also has a short eighth line M8 (see FIG. 9) formed by extending an end of the conductive pattern 61 from a starting point P8, the end being the other end of the secondary coil 6-2. Then, the seventh line M7 and the third line M3 are connected to each other via the through hole 74j in the non-magnetic layer 74, while the internal electrode 61a of the eighth line M8 is used as a balanced terminal, as will be described below.

As illustrated in FIG. 1, the external electrodes 4-1 to 4-6 are formed outside the main body of the chip configured as described above.

The external electrode 4-1 is electrically connected to both the internal electrodes 52a and 64a of the conductive patterns 52 and 64, while the external electrode 4-2 is electrically connected to the internal electrode 51a of the conductive pattern 51. The external electrode 4-3 is electrically connected to the internal electrode 61a of the conductive pattern 61, the external electrode 4-4 is electrically connected to both the internal electrodes 53a and 63a of the conductive patterns 53 and 63, and the external electrode 4-5 is electrically connected to both the internal electrodes 54a and 62a of the conductive patterns 54 and 62.

Figure 11:
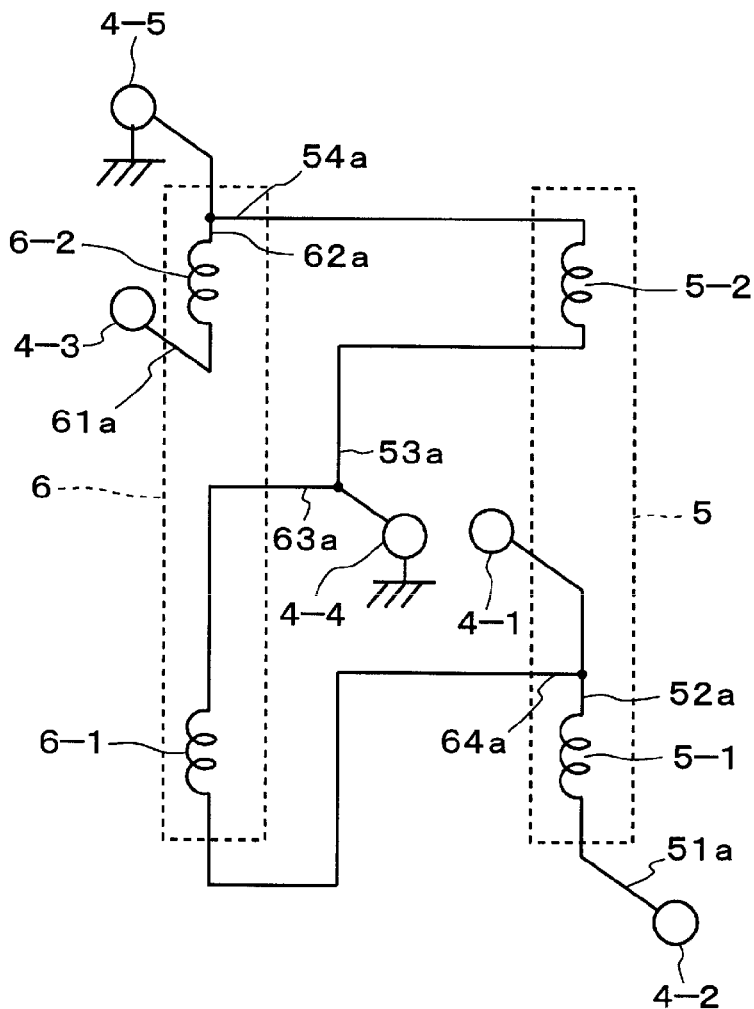
FIG. 11 is a schematic diagram illustrating an electrical structure of first and second transformers.

FIG. 11 is a schematic diagram illustrating an electrical structure of the first and second transformers 5 and 6.

On the basis of the above-described connections between the conductive patterns and between the external electrodes 4-1 to 4-6 and the internal electrodes, the electrical structure, such as a circuit configuration of FIG. 11, is realized.

The external electrode 4-1 connected to the internal electrode 52a of the primary coil 5-1 in the first transformer 5 is used as an unbalanced terminal, while the external electrode 4-2 connected to the internal electrode 51a is used as a balanced terminal. The external electrodes 4-4 and 4-5 connected to the internal electrodes 53a and 54a, respectively, at opposite ends of the secondary coil 5-2 are used as ground terminals. The internal electrode 64a of the primary coil 6-1 in the second transformer 6 is connected to the internal electrode 52a of the primary coil 5-1. The internal electrode 63a is connected through the external electrode 4-4 to the internal electrode 53a of the secondary coil 5-2 in the first transformer 5. The internal electrode 62a of the secondary coil 6-2 is connected to the internal electrode 54a of the secondary coil 5-2 in the first transformer 5. The external electrode 4-3 connected to the internal electrode 61a of the secondary coil 6-2 is used as a balanced terminal.

Figure 19:
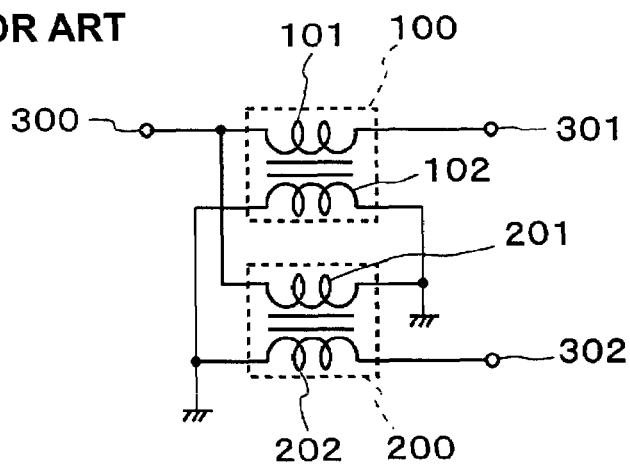
FIG. 19 is an equivalent circuit diagram of a one-to-four type balun transformer.

This circuit configuration is equivalent to that of the equivalent circuit of the one-to-four type balun transformer illustrated in FIG. 19. Therefore, this laminated balun transformer is capable of making the ratio of impedance at the external electrode 4-1 serving as an unbalanced terminal to impedance at the external electrodes 4-2 and 4-3 serving as balanced terminals to be one to four.

As illustrated in FIG. 1, the laminated balun transformer of the present preferred embodiment has a structure in which the first transformer 5 and the second transformer 6 are arranged side by side in the non-magnetic body 7 in a direction substantially parallel to the magnetic substrate 1. In the present preferred embodiment, moreover, the secondary coil 6-2 of the second transformer 6 is configured to be 180-degree rotationally symmetric relative to the primary coil 5-1 of the first transformer 5 with respect to a center line L, while the primary coil 6-1 of the second transformer 6 is configured to be 180-degree rotationally symmetric relative to the secondary coil 5-2 of the first transformer 5 with respect to the center line L.

A more specific description will be given below.

Figure 12:
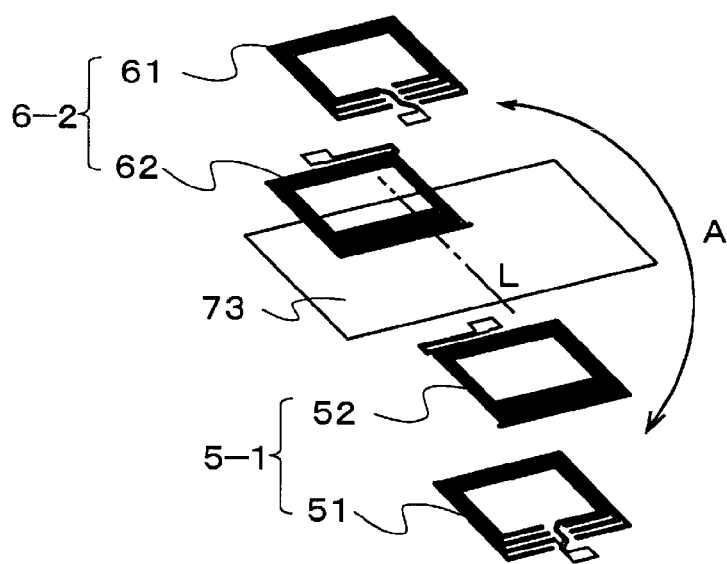
FIG. 12 is an exploded perspective view illustrating a 180-degree rotationally symmetric state of a secondary coil of the second transformer and a primary coil of the first transformer.
Figure 13:
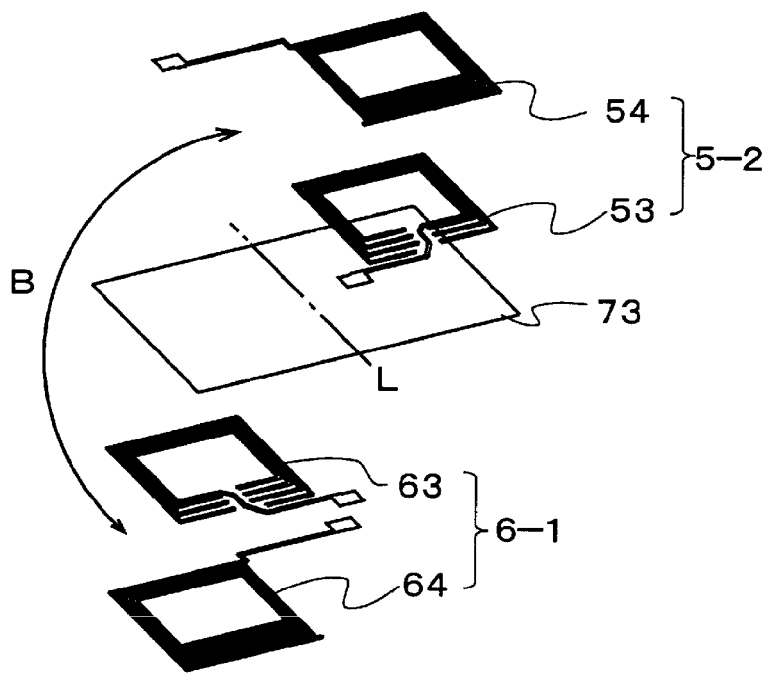
FIG. 13 is an exploded perspective view illustrating a 180-degree rotationally symmetric state of a primary coil of the second transformer and a secondary coil of the first transformer.

FIG. 12 is an exploded perspective view illustrating a 180-degree rotationally symmetric state of the secondary coil 6-2 of the second transformer 6 and the primary coil 5-1 of the first transformer 5. FIG. 13 is an exploded perspective view illustrating a 180-degree rotationally symmetric state of the primary coil 6-1 of the second transformer 6 and the secondary coil 5-2 of the first transformer 5.

As illustrated in FIG. 1, the center line L is in a horizontal plane extending between the primary coils 5-1 and 6-1 and the secondary coils 5-2 and 6-2 of the first and second transformers 5 and 6. More specifically, the center line L extends in and along the non-magnetic layer 73 in a manner to pass therethrough. The center line L also lies in a gap G between the first and second transformers 5 and 6. That is, the center line L points toward the opposite external electrodes 4-1 to 4-6, extends in and along the non-magnetic layer 73 in a manner to pass therethrough, and lies in the middle of the gap G as viewed across the width (in the horizontal direction of FIG. 1).

Then, as indicated by arrow A of FIG. 12, the primary coil 5-1 of the first transformer 5 and the secondary coil 6-2 of the second transformer 6 are configured to be 180-degree rotationally symmetric with respect to the center line L. Also, as indicated by arrow B of FIG. 13, the secondary coil 5-2 of the first transformer 5 and the primary coil 6-1 of the second transformer 6 are configured to be 180-degree rotationally symmetric with respect to the center line L.

Figure 14:
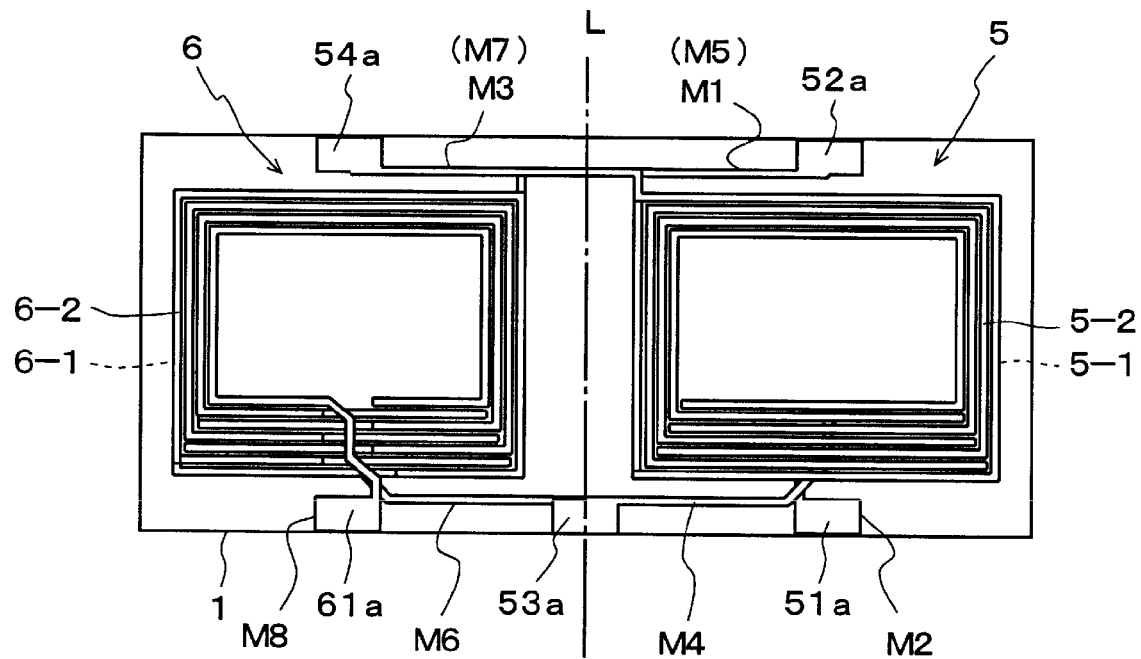
FIG. 14 is a plan view illustrating a state in which first to eighth lines of the first and second transformers are equally distributed on both sides of a center line.

FIG. 14 is a plan view illustrating a state in which the first to eighth lines M1 to M8 of the first and second transformers 5 and 6 are equally distributed on both sides of the center line L.

As described above, the primary and secondary coils 6-1 and 6-2 of the second transformer 6 are configured to be 180-degree rotationally symmetric relative to the secondary and primary coils 5-2 and 5-1 of the first transformer 5 with respect to the center line L. Therefore, as illustrated in FIG. 14 and FIG. 1, when the laminated balun transformer is viewed from above, the first line M1 and the seventh line M7, the second line M2 and the eighth line M8, the third line M3 and the fifth line M5, and the fourth line M4 and the sixth line M6 are equally distributed on both sides of the center line L in a line symmetrical manner.

Therefore, two lines equally distributed on both sides of the center line L have the same inductance value. That is, inductance values of the first line M1, second line M2, third line M3, and fourth line M4 are the same as those of the seventh line M7, eighth line M8, fifth line M5, and sixth line M6, respectively.

More specifically, as illustrated in FIG. 5 (FIG. 7), when an inductance value in the line segment from the starting point P1 (P7) to a bent point P1' (P7') of the first line M1 (seventh line M7) is L3 and an inductance value in the line segment extending beyond the bent point P1' (P7') of the first line M1 (seventh line M7) is L1, an inductance value of the first line M1 (seventh line M7) is given by L1+L3. As illustrated in FIG. 3 (FIG. 9), an inductance value of the second line M2 (eighth line M8) is L4. Then, when an inductance value in the line segment from the starting point P3 (P5) to an intermediate point P3' (P5') of the third line M3 (fifth line M5) is L2, an inductance value in the line segment extending beyond the intermediate point P3' (P5') of the third line M3 (fifth line M5) is L1. Therefore, an inductance value of the third line M3 (fifth line M5) is given by L1+L2. As illustrated in FIG. 7 (FIG. 5), an inductance value of the fourth line M4 (sixth line M6) is L5.

Next, functions and effects of the laminated balun transformer according to the present preferred embodiment will be described.

Referring to FIG. 2, assume that the external electrode 4-1 serving as an unbalanced terminal is connected, for example, to a line with an impedance of 50 ohms; the external electrodes 4-2 and 4-3 serving as balanced terminals are connected, for example, to a balanced line with an impedance of 200 ohms; and the external electrodes 4-4 and 4-5 serving as ground terminals are grounded. Thus, the unbalanced and balanced lines having an impedance ratio of one to four can be effectively connected to each other by the laminated balun transformer. As a result, when an unbalanced signal is input from the external electrode 4-1, a pair of balanced signals (differential signals) having a phase difference of 180 degrees is output from the external electrodes 4-4 and 4-5.

When the laminated balun transformer deals with high-frequency signals, parasitic inductance occurs at many points in inter-transformer connection lines for connection between transformers. This may adversely affect balance characteristics (i.e., amplitude balance and phase balance) between balanced signals input to and output from the external electrodes 4-2 and 4-3.

Figure 15:
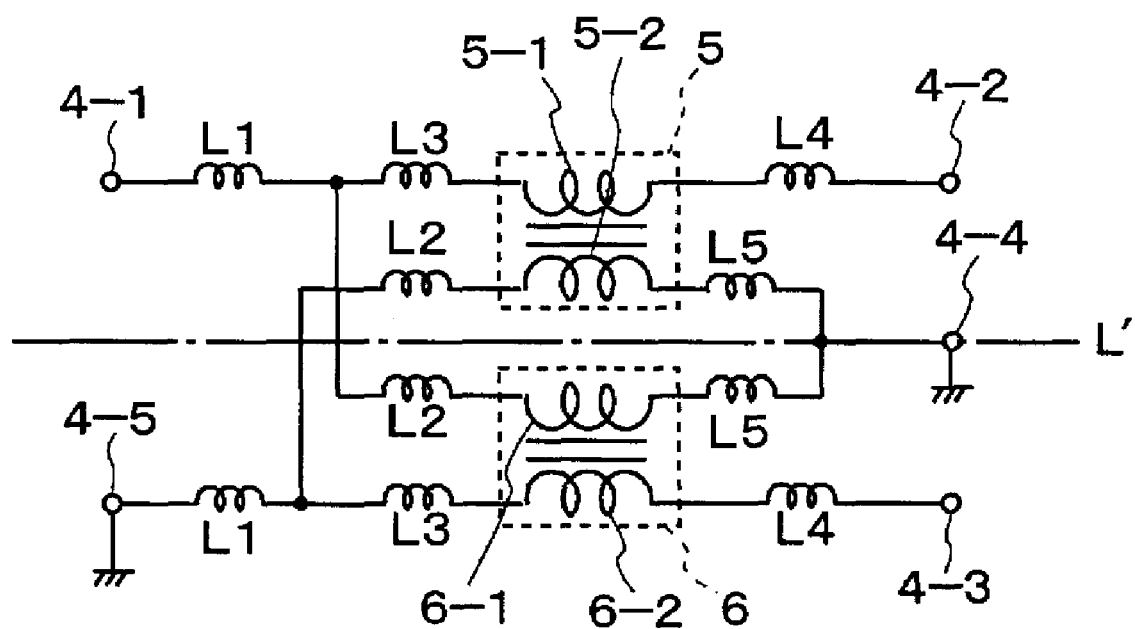
FIG. 15 is a circuit diagram illustrating parasitic inductances that occur in a balun transformer.

FIG. 15 is a circuit diagram illustrating parasitic inductances that occur in the balun transformer.

As illustrated in FIG. 3 to FIG. 9, the first and seventh lines M1 and M7 have an inductance value of L1+L3, the second and eighth lines M2 and M8 have an inductance value of L4, the third and fifth lines M3 and M5 have an inductance value of L1+L2, and the fourth and sixth lines M4 and M6 have an inductance value of L5. Therefore, in the laminated balun transformer of the present preferred embodiment, parasitic inductances L1 to L5 occur as illustrated in FIG. 15.

However, as described above, the laminated balun transformer of the present preferred embodiment is configured such that two lines equally distributed on both sides of the center line L have the same inductance value, that is, the inductance values of the first line M1, second line M2, third line M3, and fourth line M4 are the same as those of the seventh line M7, eighth line M8, fifth line M5, and sixth line M6, respectively. Therefore, parasitic inductances on both sides of the center line L are balanced. In other words, in the circuit of FIG. 15, since the parasitic inductances L1 to L5 are symmetrically and equally distributed on both sides of the center line L', amplitudes and phases of signals flowing on both sides of the center line L' are balanced. As a result, balance characteristics (i.e., amplitude balance and phase balance) of balanced signals output from the external electrodes 4-2 and 4-3 serving as balanced terminals are improved.

Additionally, in the laminated balun transformer of the present preferred embodiment, as illustrated in FIG. 3 to FIG. 9, since line lengths which cause the parasitic inductances L2, L3, and L4 are extremely small, the effects of parasitic inductances L2, L3, and L4 can be reduced to substantially zero.

Since the other parasitic inductances L1 and L5 are inductances of lines drawn to distant points, their inductance values are not so small. However, as illustrated in FIG. 15, since the parasitic inductances L1 and L5 are symmetrically and equally distributed on both sides of the center line L', the negative effects of the parasitic inductances L1 and L5 on the amplitude balance and phase balance of input and output balanced signals are small.

As described above, with the laminated balun transformer of the present preferred embodiment, it is possible not only to improve the balance characteristics of a pair of balanced signals input to and output from the external electrodes 4-2 and 4-3, but also to suppress the occurrence of parasitic inductance.

It will be understood that although the non-magnetic body 7 is used as an insulator in the present preferred embodiment, a magnetic body may be used as an insulator constituting the laminated body 2.

Second Preferred Embodiment

A second preferred embodiment of the present invention will now be described.

Figure 16:
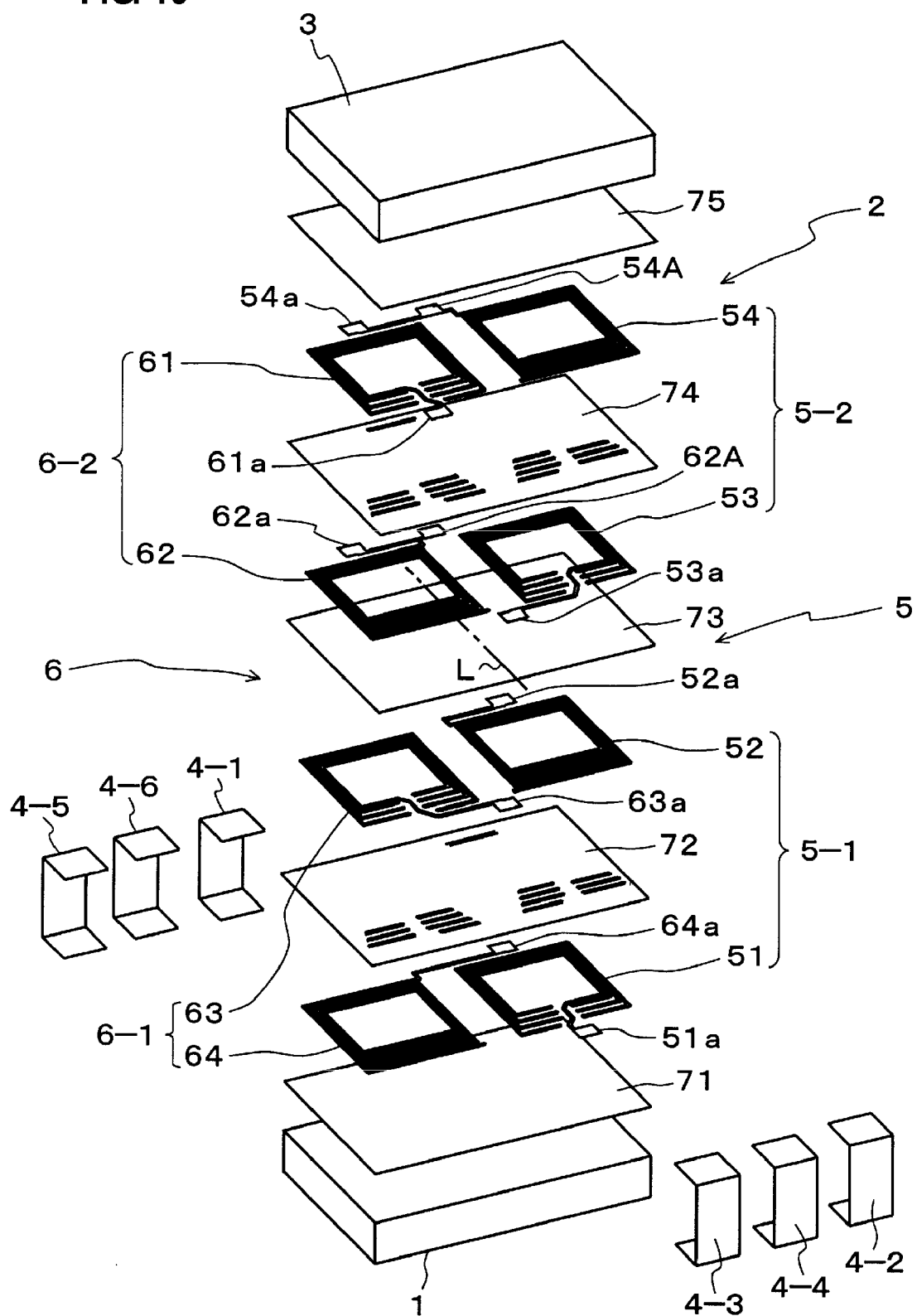
FIG. 16 is an exploded perspective view of a laminated balun transformer according to a second preferred embodiment of the present invention.
Figure 17:
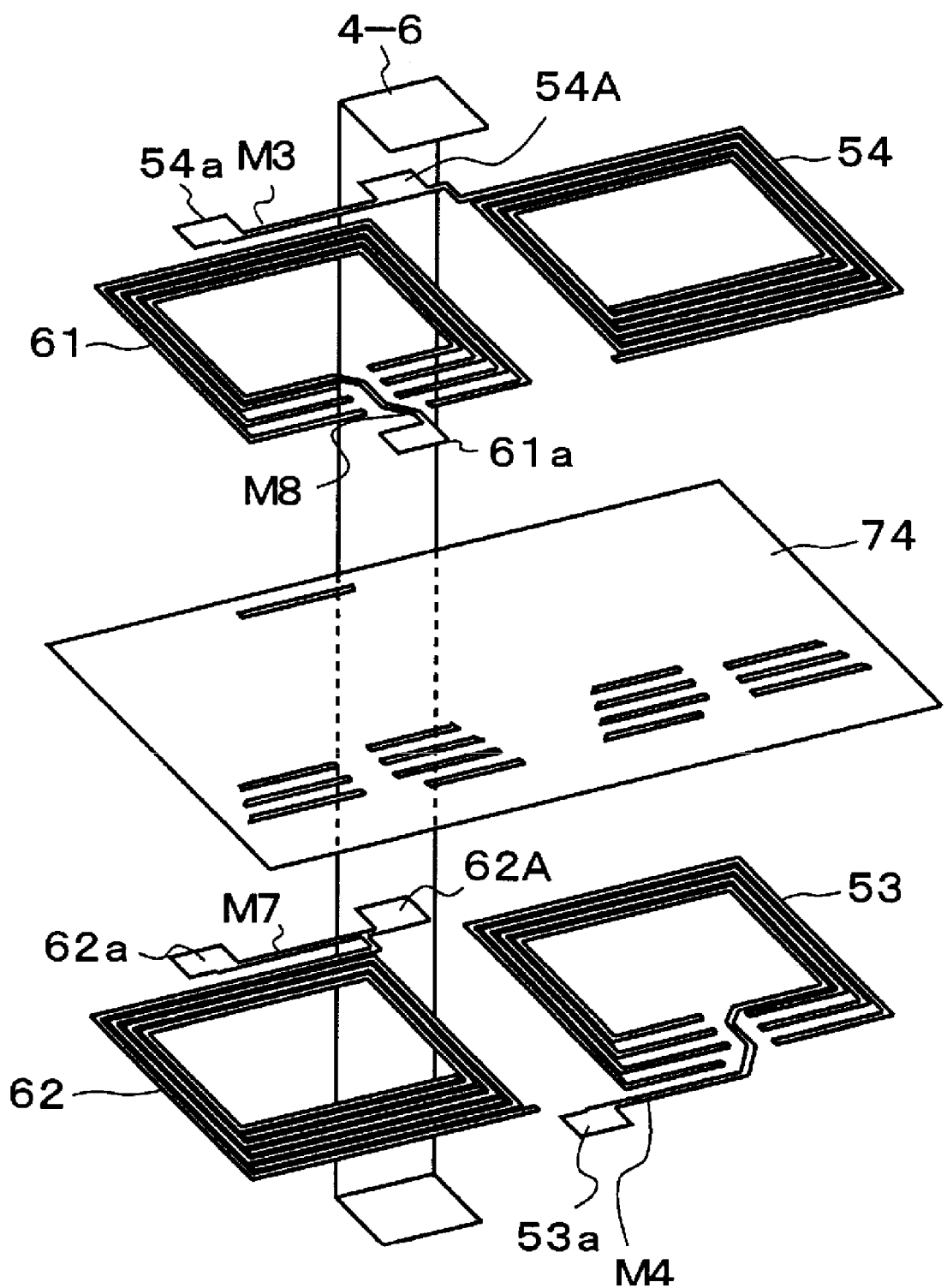
FIG. 17 is an exploded perspective view illustrating a connection of the third and seventh lines and an external electrode.
Figure 18:
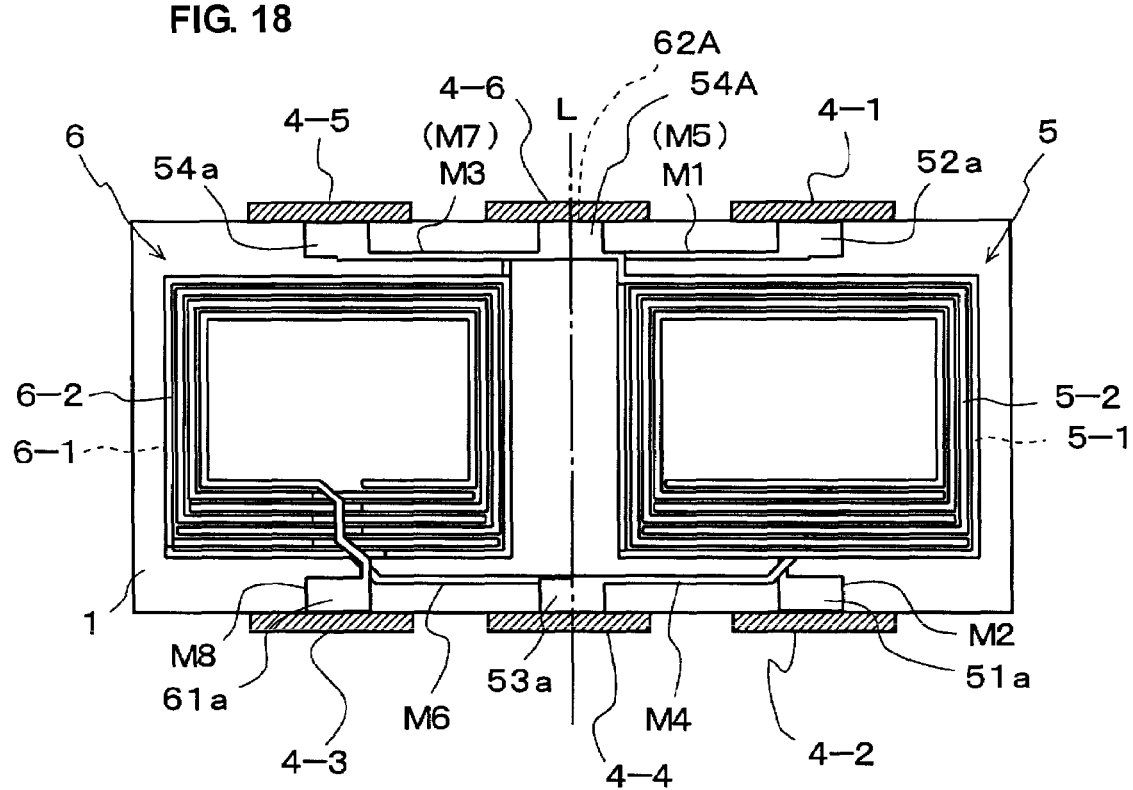
FIG. 18 is a plan view illustrating a state in which the first to eighth lines of the first and second transformers, the first to eighth lines being equally distributed on both sides of the center line, are connected to the external electrodes.

FIG. 16 is an exploded perspective view of a laminated balun transformer according to the second preferred embodiment of the present invention. FIG. 17 is an exploded perspective view illustrating a connection of the third and seventh lines M3 and M7 and the external electrode 4-6. FIG. 18 is a plan view illustrating a state in which the first to eighth lines of the first and second transformers, the first to eighth lines being equally distributed on both sides of the center line, are connected to the external electrodes 4-1 to 4-6.

As illustrated in FIG. 16 and FIG. 17, the present preferred embodiment differs from the first preferred embodiment in that internal electrodes 54A and 62A connected to the external electrode 4-6 are provided at intermediate portions of the third line M3 and the seventh line M7, respectively, of the laminated balun transformer.

In the first preferred embodiment described above, as illustrated in FIG. 1 and FIG. 2, the external electrodes 4-1, 4-6, and 4-5, which are first to third external electrodes, are provided on one outer side of the laminated body 2 such that they are equally spaced in sequence in a direction in which the first and second transformers 5 and 6 are arranged (i.e., in order from right to left). Additionally, the external electrodes 4-2, 4-4, and 4-3, which are fourth to sixth external electrodes, are provided on the opposite outer side of the laminated body 2 such that they face the external electrodes 4-1, 4-6, and 4-5, respectively.

Moreover, as illustrated in FIG. 3 to FIG. 11, the internal electrode 52a (unbalanced terminal) of the first line M1 and the internal electrode 64a of the fifth line M5 are connected to the external electrode 4-1, while the internal electrode 51a (balanced terminal) of the second line M2 is connected to the external electrode 4-2. Also, the internal electrode 54a (ground terminal) of the third line M3 and the internal electrode 62a of the seventh line M7 are connected to the external electrode 4-5 for grounding, while the internal electrode 53a (ground terminal) of the fourth line M4 and the internal electrode 63a of the sixth line M6 are connected to the external electrode 4-4 for grounding. Additionally, the internal electrode 61a (balanced terminal) of the eighth line M8 is connected to the external electrode 4-3.

The configuration described above is also used in the second preferred embodiment.

However, with the above-described configuration alone, since the external electrode 4-6 is not electrically connected to the first and second transformers 5 and 6 serving as an internal circuit of the laminated body 2, large parasitic inductance and parasitic capacitance may occur in the external electrode 4-6 or between the external electrode 4-6 and the internal circuit. Therefore, insertion of this laminated balun transformer into a line may cause a large insertion loss.

Accordingly, in the present preferred embodiment, as illustrated in FIG. 16 and FIG. 17, the internal electrodes 54A and 62A for connection to the external electrode 4-6 are provided in the third and seventh lines M3 and M7, respectively.

More specifically, the internal electrodes 54A and 62A are arranged in intermediate portions of the third line M3 and seventh line M7, respectively, in a protruding manner. That is, the internal electrodes 54A and 62A are arranged in a protruding manner in intermediate portions of the third line M3 and seventh line M7, respectively, the intermediate portions being closest to the external electrode 4-6. Then, as in the case of the external electrode 4-5, the external electrode 4-6 is used as an electrode for grounding.

With this configuration, as illustrated in FIG. 17, since the third and seventh lines M3 and M7 are connected to the external electrode 4-6 through the internal electrodes 54A and 62A, respectively, it is possible to reduce parasitic inductance and parasitic capacitance that may occur in the external electrode 4-6 or between the external electrode 4-6 and the internal circuit. Moreover, as illustrated in FIG. 18, the first line M1 and the seventh line M7, the second line M2 and the eighth line M8, the third line M3 and the fifth line M5, and the fourth line M4 and the sixth line M6 are equally distributed on both sides of the center line L in a line symmetrical manner, while the internal electrodes 54A and 62A are located on the center line L. Therefore, the electrical circuit configuration of the laminated balun transformer is balanced. From these points of view, it can be expected that the laminated balun transformer of the present preferred embodiment will be able to reduce insertion loss more significantly than in the case of the first embodiment described above.

For confirmation of this assumption, the present inventors have performed a simulation.

In the simulation, the laminated balun transformer of each of the first and second preferred embodiments was mounted on a line. Then, the insertion loss (dB) of each laminated balun transformer was calculated with respect to each of high frequencies, 50 MHz, 100 MHz, and 870 MHz.

The result showed that the laminated balun transformer of the first preferred embodiment had insertion losses of −1.015 dB, −0.899 dB, and −1.124 dB at high frequencies of 50 MHz, 100 MHz, and 870 MHz, respectively. On the other hand, it was confirmed that the laminated balun transformer of the present preferred embodiment had very low insertion losses of −0.953 dB, −0.848 dB, and −1.071 dB at the high frequencies described above.

The laminated balun transformer of the present preferred embodiment has a configuration in which the internal electrodes 54A and 62A are arranged in a protruding manner in both the third and seventh lines M3 and M7, respectively, and that both the third and seventh lines M3 and M7 are connected to the external electrode 4-6. However, the laminated balun transformer may be configured such that only one of the internal electrodes 54A and 62A is provided in one of the third and seventh lines M3 and M7, and that only one of the third and seventh lines M3 and M7 is connected to the external electrode 4-6. This laminated balun transformer provides substantially the same functions and effects as those of the laminated balun transformer of the present preferred embodiment.

The other configurations, functions, and effects will not be described here, as they are similar to those of the first preferred embodiment described above.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated balun transformer comprising:
a first magnetic substrate;
a laminated body laminated on the first magnetic substrate and including a first transformer and a second transformer; and
a second magnetic substrate disposed on the laminated body; wherein
the first transformer and the second transformer each include a primary coil and a secondary coil facing each other, and the first transformer and the second transformer are provided side by side in an insulator included in the laminated body such that the first transformer and the second transformer are arranged in a direction substantially parallel to the first magnetic substrate;
an end portion of a first line defined by an extension of one end of the primary coil in the first transformer is an unbalanced terminal, an end portion of a second line defined by an extension of the other end of the primary coil in the first transformer is a balanced terminal, end portions of a third line and a fourth line defined by an extension of opposite ends of the secondary coil in the first transformer are ground terminals, a fifth line defined by an extension of one end of the primary coil in the second transformer is connected to the first line of the first transformer, a sixth line defined by an extension of the other end of the primary coil in the second transformer is connected to the fourth line of the first transformer, a seventh line defined by an extension of one end of the secondary coil in the second transformer is connected to the third line of the first transformer, an end portion of an eighth line defined by an extension of the other end of the secondary coil in the second transformer is a balanced terminal, and a ratio of impedance at a side of the unbalanced terminal to impedance at a side of the balanced terminals is set to one to four;
the secondary coil of the second transformer is configured to be 180-degree rotationally symmetric relative to the primary coil of the first transformer with respect to a center line lying in a horizontal plane between the primary coils and the secondary coils of the first and second transformers and located in a gap between the first and second transformers, and the primary coil of the second transformer is configured to be 180-degree rotationally symmetric relative to the secondary coil of the first transformer with respect to the center line; and inductance values of the first line of the first transformer and the seventh line of the second transformer, the second line of the first transformer and the eighth line of the second transformer, the third line of the first transformer and the fifth line of the second transformer, and the fourth line of the first transformer and the sixth line of the second transformer that are equally distributed on both sides of the center line are equal to each other, and the inductance values of the first line, second line, third line, and fourth line are equal to the inductance values of the seventh line, eighth line, fifth line, and sixth line, respectively.

2. The laminated balun transformer according to claim 1, further comprising:

a first external electrode, a second external electrode, and a third external electrode arranged on one outer side of the laminated body so as to be equally spaced in sequence in a direction in which the first and second transformers are arranged; and a fourth external electrode, a fifth external electrode, and a sixth external electrode arranged on another outer side of the laminated body, the another outer side being opposite the one outer side, such that the fourth, fifth, and sixth external electrodes face the first, second, and third external electrodes, respectively, wherein the unbalanced terminal being the end portion of the first line is connected to the first external electrode, the balanced terminal being the end portion of the second line is connected to the fourth external electrode, the ground terminal being the end portion of the third line and the ground terminal being the end portion of the fourth line are connected to the third external electrode and fifth external electrode for grounding, respectively, and the balanced terminal being the end portion of the eighth line is connected to the sixth external electrode; and one or both of portions is or are connected to the second external electrode, with the one portion being an intermediate portion of the third line toward the third external electrode and located near the second external electrode for grounding and the other portion being an intermediate portion of the seventh line and located near the second external electrode.

* * * * *